United States Patent [19]
Koike et al.

[11] Patent Number: 5,569,548
[45] Date of Patent: Oct. 29, 1996

[54] ZINC OXIDE PIEZOELECTRIC CRYSTAL FILM ON SAPPHIRE PLANE

[75] Inventors: Jun Koike; Hideharu Ieki, both of Kyoto, Japan

[73] Assignee: Murata Manufacturing Co., Ltd., Japan

[21] Appl. No.: 284,889

[22] Filed: Aug. 2, 1994

[30] Foreign Application Priority Data

Aug. 5, 1993 [JP] Japan .................................. 5-215091

[51] Int. Cl.⁶ ............................................... B32B 18/00
[52] U.S. Cl. ............................ 428/699; 428/700; 428/701; 428/910; 310/313 A; 310/360
[58] Field of Search ..................................... 428/699, 700, 428/701, 702, 910; 427/100; 310/313 R, 313 A, 360; 252/62.9

[56] References Cited

U.S. PATENT DOCUMENTS

| | | | |
|---|---|---|---|
| 3,664,867 | 11/1969 | Galli et al. | 117/201 |
| 3,766,041 | 10/1973 | Wasa | 204/192.18 |
| 4,142,124 | 2/1979 | Ogawa | 310/360 |
| 4,336,120 | 6/1982 | Sakakura | 204/192.18 |
| 4,501,987 | 2/1985 | Mitsuyu et al. | 310/313 |
| 5,061,870 | 7/1990 | Ieki et al. | 310/313 |
| 5,152,864 | 7/1991 | Ieki et al. | 156/610 |
| 5,162,690 | 4/1990 | Ieki et al. | 310/313 |

OTHER PUBLICATIONS

CRC Handbook of Chemistry and Physics, 66th Ed., 1985, p. F–164.
European Search Report dated Dec. 8, 1994.

*Primary Examiner*—Ellis Robinson
*Assistant Examiner*—Leonidas J. Jones, III
*Attorney, Agent, or Firm*—Ostrolenk, Faber, Gerb & Soffen, LLP

[57] ABSTRACT

When a zinc oxide piezoelectric crystal film is epitaxially grown on an R-plane sapphire substrate by sputtering, a target containing not more than 4.5 percent by weight of Cu with respect to the total content of Zn and Cu is employed so that the zinc oxide piezoelectric film contains Cu. Thus, it is possible to obtain a zinc oxide piezoelectric crystal film having excellent orientation.

13 Claims, 2 Drawing Sheets

ZINC OXIDE PIEZOELECTRIC CRYSTAL FILM ON SAPPHIRE PLANE

BACKGROUND OF THE INVENTION

1. Field of the Invention

The present invention relates to a zinc oxide piezoelectric crystal film provided on a sapphire plane, which is employed for propagating surface acoustic waves in a surface acoustic wave device.

2. Description of the Background Art

A typical surface acoustic wave (SAW) substrate for a SAW device is prepared by providing a piezoelectric crystal film on a non-piezoelectric substrate. In such a SAW substrate, a transducer which is formed by an interdigital electrode is provided on an outer surface of the piezoelectric crystal film or an interface between the piezoelectric crystal film and the non-piezoelectric substrate, in order to excite surface acoustic waves.

In relation to the aforementioned SAW substrate, known is a SAW substrate which is formed by a non-piezoelectric substrate of sapphire ($\alpha$-$Al_2O_3$) and a piezoelectric crystal film of zinc oxide (ZnO). In relation to such a zinc oxide/sapphire SAW substrate, further, ($01\bar{1}2$)-plane cut sapphire (hereinafter referred to as "R-plane sapphire") is employed so that ($11\bar{2}0$)-plane zinc oxide (hereinafter referred to as "Q-plane ZnO") is epitaxially grown on its R-plane.

FIG. 1 shows a SAW substrate 3 which is obtained by growing a Q-plane ZnO epitaxial film 2 on an R-plane sapphire substrate 1, as described above. In relation to such a SAW substrate 3, it is known that the SAW substrate 3 provides a high sound velocity and high coupling when the R-plane of the sapphire substrate 1 and the Q-plane of the ZnO epitaxial film 2 are parallel to each other and the [0001] direction (C-axis direction) of the ZnO epitaxial film 2 and the [$0\bar{1}11$] direction (D-axis direction) of the sapphire substrate 1 are in parallel with each other as shown by arrows in FIG. 1.

In order to form the ZnO epitaxial film 2 on the sapphire substrate 1, chemical transportation, CVD or sputtering is employed in general, while sputtering is widely employed among such processes, in particular.

When a pure ZnO thin film is formed on an R-plane sapphire substrate by sputtering, for example, its orientation is still insufficient for putting a SAW substrate which is formed by such a ZnO thin film into practice, although the C-axis of ZnO is parallel to the surface of the sapphire substrate to some extent and a certain degree of orientation is attained on the Q-plane of ZnO. As the result, characteristics of the interdigital transducer such as the electromechanical coupling factor are inferior to predetermined values in a SAW device employing such a SAW substrate.

SUMMARY OF THE INVENTION

Accordingly, an object of the present invention is to attain improvement in crystal orientation of a ZnO piezoelectric crystal film which is epitaxially grown on the aforementioned R-plane sapphire substrate.

The present invention is directed to a Q-plane ZnO piezoelectric crystal film which is epitaxially grown on an R-plane of sapphire, and the feature of the present invention resides in that the ZnO piezoelectric crystal film contains not more than 4.5 percent by weight of Cu with respect to the total content of Zn and Cu.

The aforementioned Cu content with respect to the total content of Zn and Cu is preferably selected in a range of 0.4 to 4.0 percent by weight, more preferably 0.6 to 3.0 percent by weight, and most preferably 0.9 to 2.0 percent by weight.

In the present invention, the R-plane of sapphire on which the ZnO piezoelectric crystal film is formed is dispersed in manufacturing by about ±2% with respect to a strict R-plane. However, dispersion in such a range substantially leads to no difference in effect. In other words, it is possible to form a Q-plane ZnO epitaxial film on sapphire, even if its cut plane deviates by about ±2%.

According to the present invention, it is possible to obtain a Q-plane ZnO piezoelectric crystal film having excellent orientation, as clearly understood from the following description of the embodiment. According to a SAW substrate which is formed by such a ZnO piezoelectric crystal film, therefore, it is possible to improve characteristics of an interdigital transducer such as an electromechanical coupling factor, thereby implementing a sufficiently practicable SAW device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
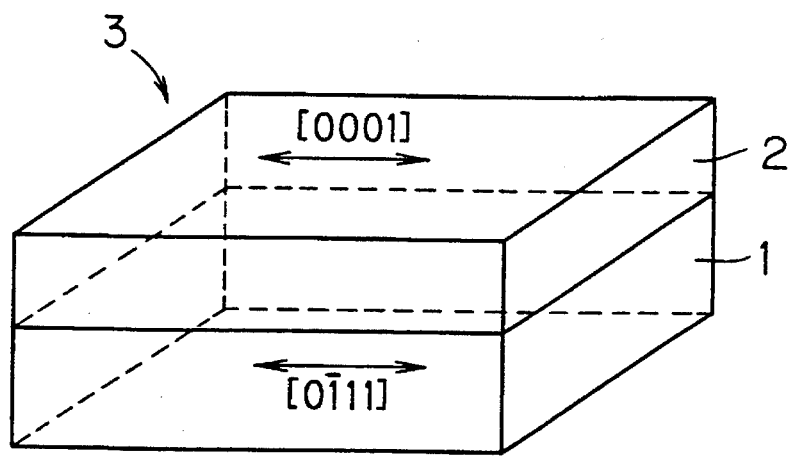
FIG. 1 is a perspective view illustrating a SAW substrate which is of interest to the present invention.

As shown in FIG. 1 and described above, the present invention is directed to a SAW substrate 3 which is obtained by growing a Q-plane ZnO epitaxial film 2 on an R-plane sapphire substrate 1, and in this SAW substrate 3, the C-axis of the ZnO epitaxial film 2 is parallel to the D-axis of the sapphire substrate 1. The ZnO epitaxial film 2 is not made of pure ZnO, but contains Cu. The Cu content is selected to be not more than 4.5 percent by weight with respect to the total content of Zn and Cu. The ZnO epitaxial film 2 containing such a prescribed amount of Cu has excellent orientation.

Processes of forming the Q-plane ZnO epitaxial film 2 containing a prescribed amount of Cu on the R-plane sapphire substrate 1 include chemical transportation, CVD and sputtering, as described above. It is possible to obtain the ZnO epitaxial film 2 which is excellent in surface flatness with high crystal quality at a lower temperature by sputtering, in particular.

Figure 2:
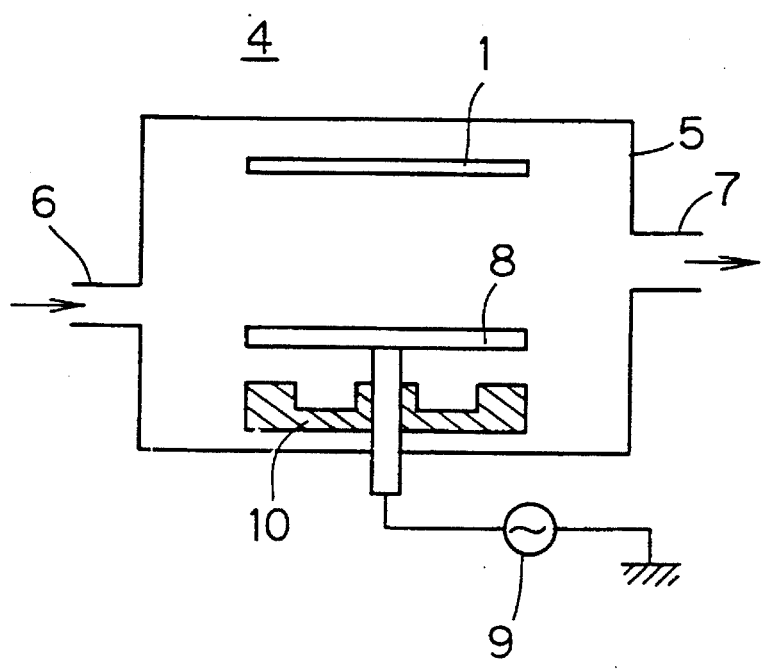
FIG. 2 is a sectional view illustrating an RF magnetron sputterer.

FIG. 2 shows an RF magnetron sputterer 4, as an exemplary sputterer. This sputterer 4 comprises an airtight container 5, which is provided with a gas inlet port 6 and a gas outlet port 7. A proper sputtering gas is introduced into the container 5 through the gas inlet port 6, while a gas remaining in the container 5 is forcibly discharged by a pump (not shown) through the gas outlet port 7. The aforementioned R-plane sapphire substrate 1 is arranged in the container 5, and a target 8 is arranged under the sapphire substrate 1 to be opposed to the same. A high-frequency (RF) power source 9 applies a high-frequency voltage across an anode (not shown) and a cathode (not shown) which are positioned on upper and lower surfaces of the sapphire substrate 1 and the target 8 respectively. A magnet 10 is located under the target 8.

Through such a sputterer 4, the ZnO epitaxial film 2 containing a prescribed amount of Cu is grown on the sapphire substrate 1 in either one of the following modes:

In a first mode, the target 8 is prepared from a Zn metal target which is doped with a prescribed amount of Cu, while (Ar+$O_2$) gas is introduced into the container 5 through the gas inlet port 6. Ar particles strike the target 8 to make Zn particles and Cu particles jump out from the target 8, so that the Zn particles react with $O_2$ gas to form ZnO and the as-formed ZnO particles and the Cu particles adhere onto the sapphire substrate 1. Thus, it is possible to form the ZnO epitaxial film 2 containing a prescribed amount of Cu on the sapphire substrate 1.

In a second mode, on the other hand, the target 8 is prepared from a ZnO ceramic target which is doped with a prescribed amount of Cu, while Ar gas is introduced into the container 5 through the gas inlet port 6. Ar particles strike the target 8, so that ZnO particles and Cu particles thereby jumping out from the target 8 adhere onto the sapphire substrate 1. Thus, it is possible to form the ZnO epitaxial film 2 containing a prescribed amount of Cu on the sapphire substrate 1.

As hereinabove described, it is possible to make the ZnO epitaxial film 2 contain a prescribed amount of Cu by introducing a prescribed amount of Cu into the target 8. In sputtering, the composition of a target substantially coincides with that of a film as obtained. Thus, the amount of Cu which is introduced into the target corresponds to the Cu content in the ZnO epitaxial film as obtained.

In order to confirm the effect of addition of Cu to a Q-plane ZnO film epitaxially grown on an R-plane sapphire substrate, the following experiment was made through the sputterer 4 shown in FIG. 2.

First, some Zn metal targets which were doped with various contents of Cu were employed to form ZnO epitaxial films containing Cu on R-plane sapphire substrates under various sputtering conditions. The various sputtering conditions were attained by changing RF power levels, substrate heating temperatures and pressures of gas (Ar:$O_2$=50:50) respectively.

On the other hand, pure Zn metal targets were employed to form ZnO epitaxial films on R-plane sapphire substrates under various sputtering conditions which were similar to the above.

Figure 3:
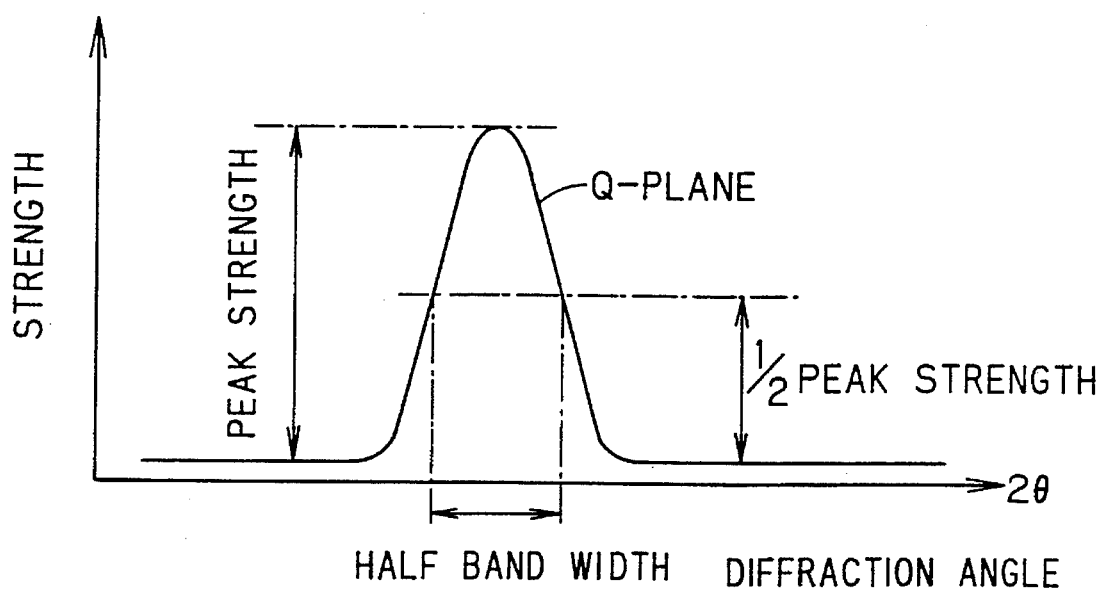
FIG. 3 is a diagram for illustrating definition of a diffraction peak half band width.

The ZnO epitaxial films of the samples as obtained were evaluated by an X-ray diffractometer process. This process is adapted to evaluate crystallinity of a ZnO epitaxial film through diffracted waves obtained by irradiating the film with X-rays. In more concrete terms, a peak is obtained in such a ZnO epitaxial film by diffracted waves from a crystal plane which is parallel to a sapphire substrate, i.e., the Q-plane of ZnO, and crystal orientation is improved, i.e., crystal planes are regularized further in parallel as the peak strength is increased. Such peak strength values were evaluated by widths of diffraction strength values at positions half the peak strength values, i.e., half band widths, as shown in FIG. 3. Thus, films having smaller half band widths are high-quality films having excellent crystal orientation properties, i.e., crystal planes which were regularized further in parallel.

Table 1 shows diffraction peak half band widths of Q-planes of ZnO obtained by employing pure Zn targets and Zn targets doped with 2 percent by weight of Cu (Zn-Cu targets), forming ZnO epitaxial films under various sputtering conditions and analyzing the same by an X-ray diffractometer process.

TABLE 1

| RF Power (kW) | Substrate Temperature (°C.) | Gas Pressure (Torr) | Peak Half Band Width (°) | |
|---|---|---|---|---|
| | | | Zn Target | Zn—Cu Target |
| 2.2 | 200 | $5 \times 10^{-3}$ | 1.5 | 1.10 |
| 2.2 | 250 | $5 \times 10^{-3}$ | 1.3 | 0.65 |
| 1.0 | 150 | $5 \times 10^{-3}$ | 2.4 | 1.26 |
| 1.0 | 200 | $5 \times 10^{-3}$ | 2.0 | 1.13 |
| 1.0 | 250 | $5 \times 10^{-3}$ | 1.1 | 0.44 |

As understood from Table 1, the ZnO epitaxial films prepared from the Zn-Cu targets had smaller peak half band widths and were therefore crystallinically superior as compared with those prepared from the Zn targets under all sputtering conditions.

Figure 4:
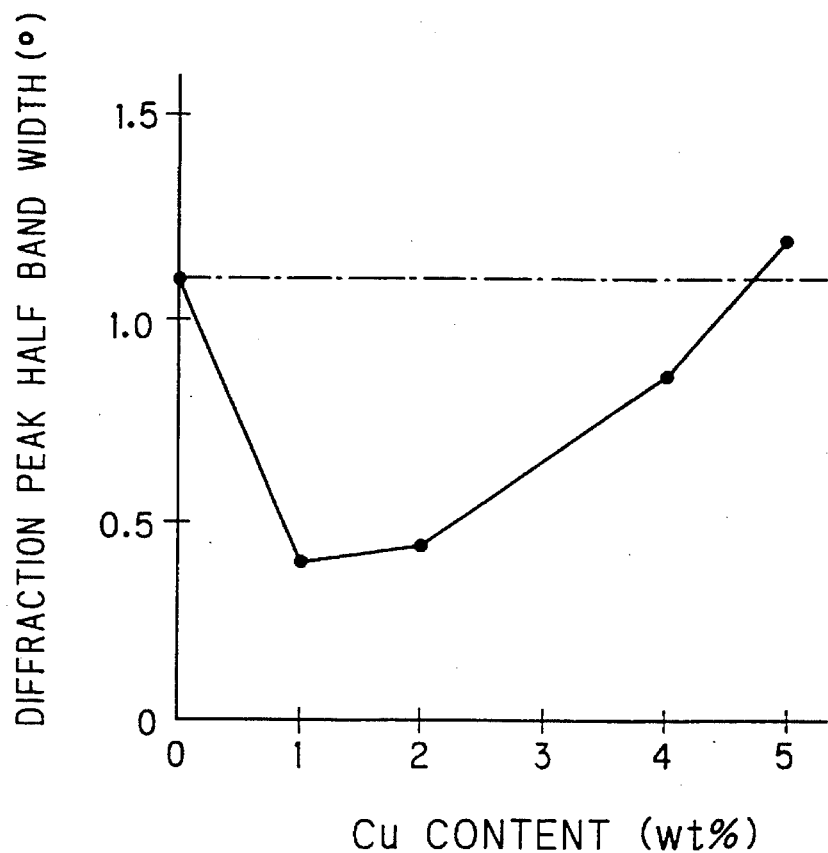
FIG. 4 illustrates changes of diffraction peak half band widths in ZnO thin films with respect to Cu content.

When such a ZnO/sapphire substrate is employed as a SAW substrate, the half band width of the diffraction peak is preferably smaller than about 0.8° in practice. In this point, when the Zn targets were employed, no films having excellent practicality were obtained under all sputtering conditions shown in Table 1. On the other hand, it is understood possible to obtain a sufficiently practical ZnO epitaxial film when a Zn-Cu target is employed, by selecting sputtering conditions. Table 2 shows peak half band widths which were obtained when amounts of Cu introduced into targets were varied in a range of 0 to 5 percent by weight with respect to the total contents of Zn and Cu under the sputtering conditions exhibiting the smallest diffraction peak half band width, i.e., RF power of 1.0 kW, a substrate temperature of 250° C. and a gas pressure of 5 by $10^{-3}$ Torr among those shown in Table 1. FIG. 4 is a graph showing the contents of Table 2.

TABLE 2

| Cu Content (wt %) | Peak Half Band Width (°) |
|---|---|
| 0 | 1.10 |
| 1 | 0.40 |
| 2 | 0.44 |
| 4 | 0.87 |
| 5 | 1.28 |

It is understood from Table 2 and FIG. 4 that crystal orientation properties were improved when the Cu contents were not more than 4.5 percent by weight, as compared with the case of the film containing no Cu. As understood from FIG. 4 in particular, the effect of improving crystallinity was made remarkable as the range of the Cu content was reduced from 0.4 to 4.0 percent by weight to 0.6 to 3.0 percent by weight, and further to 0.9 to 2.0 percent by weight.

What is claimed is:

1. A (11$\bar{2}$0)-plane zinc oxide piezoelectric crystal film being epitaxially grown on a surface of (01$\bar{1}$2) sapphire and being substantially parallel to the (01$\bar{1}$2)plane, said zinc oxide piezoelectric crystal film containing Cu in an amount of 0.4 percent to not more than 4.5 percent by weight with respect to the total content of Zn and Cu.

2. A zinc oxide piezoelectric crystal film in accordance with claim 1, containing 0.4 to 4.0 percent by weight of Cu.

3. A zinc oxide piezoelectric crystal film in accordance with claim 2, containing 0.6 to 3.0 percent by weight of Cu.

4. A zinc oxide piezoelectric crystal film in accordance with claim 3, containing 0.9 to 2.0 percent by weight of Cu.

5. A zinc oxide piezoelectric crystal film in accordance with claim 1, in which the crystal film is a sputtered film.

6. A piezoelectric crystal device consisting essentially of
a $(11\bar{2}0)$-plane zinc oxide piezoelectric crystal film epitaxially grown on a surface of $(01\bar{1}2)$ sapphire and being substantially parallel to the $(01\bar{1}2)$-plane,
said zinc oxide piezoelectric crystal film containing Cu in an amount of 0.4 percent to not more than 4.5 percent by weight with respect to the total content of Zn and Cu.

7. A device in accordance with claim 6, containing 0.4 to 4.0 % by weight of Cu.

8. A device in accordance with claim 7, containing 0.6 to 3.0% by weight of Cu.

9. A device in accordance with claim 8, containing 0.9 to 2.0% by weight of Cu.

10. A piezoelectric crystal device consisting of
a $(11\bar{2}0)$-plane zinc oxide piezoelectric crystal film being epitaxially grown on a surface of $(01\bar{1}2)$ sapphire and being substantially parallel to the $(01\bar{1}2)$-plane,
said zinc oxide piezoelectric crystal film containing Cu in an amount of 0.4 percent to not more than 4.5 percent by weight with respect to the total content of Zn and Cu.

11. A device in accordance with claim 10, containing 0.4 to 4.0% by weight of Cu.

12. A device in accordance with claim 11, containing 0.6 to 3.0% by weight of Cu.

13. A device in accordance with claim 12, containing 0.9 to 2.0% by weight of Cu.

* * * * *